United States Patent
Yang (10) Patent No.: US 11,591,267 B2
(45) Date of Patent: Feb. 28, 2023

(54) AUTOMATED PREPARATION METHOD OF A SIC$_f$/SIC COMPOSITE FLAME TUBE

(71) Applicant: CENTRAL SOUTH UNIVERSITY, Changsha (CN)

(72) Inventor: Haitang Yang, Changsha (CN)

(73) Assignee: CENTRAL SOUTH UNIVERSITY, Changsha (CN)

( * ) Notice: Subject to any disclaimer, the term of this patent is extended or adjusted under 35 U.S.C. 154(b) by 0 days.

(21) Appl. No.: 17/474,091

(22) Filed: Sep. 14, 2021

(65) Prior Publication Data
US 2022/0055954 A1    Feb. 24, 2022

(51) Int. Cl.
*C04B 35/622*    (2006.01)
*C04B 35/573*    (2006.01)
(Continued)

(52) U.S. Cl.
CPC ...... *C04B 35/62281* (2013.01); *C04B 35/573* (2013.01); *C04B 41/4505* (2013.01);
(Continued)

(58) Field of Classification Search
CPC ........ C04B 35/565–5755; C04B 35/80; C04B 41/4584; C04B 41/52
See application file for complete search history.

(56) References Cited

U.S. PATENT DOCUMENTS 5,015,540 A * 5/1991 Borom .............. C04B 35/62868
428/698
5,290,491 A * 3/1994 Heraud ............... C04B 41/4584
264/29.4
(Continued)

FOREIGN PATENT DOCUMENTS

CN      101555139 A    10/2009
CN      103979993 A    8/2014
(Continued)

OTHER PUBLICATIONS

CN 106977219 A (Luo et al.) Jul. 25, 2017 (English language machine translation), [online] [retrieved Jan. 24, 2022], Retrieved from: Espacenet. (Year: 2017).*

*Primary Examiner* — Erin Snelting (57) ABSTRACT

An automated preparation method of a SiC$_f$/SiC composite flame tube, comprising the following steps: preparing an interface layer for a SiC fiber by a chemical vapor infiltration process, and obtaining the SiC fiber with a continuous interface layer; laying a unidirectional tape on the SiC fiber with the continuous interface layer and winding the SiC fiber with the continuous interface layer to form and obtaining a preform of a net size molding according to a fiber volume and a fiber orientation obtained in a simulation calculation; and adopting a reactive melt infiltration process and the chemical vapor infiltration process successively for a densification and obtaining a high-density SiC$_f$/SiC composite flame tube in a full intelligent way. The SiC$_f$/SiC composite flame tube prepared by the present disclosure not only has a high temperature resistance, but also has a low thermal expansion coefficient, high thermal conductivity and high thermal shock resistance.

8 Claims, 7 Drawing Sheets

(51) Int. Cl.
*C04B 41/45* (2006.01)
*C04B 41/49* (2006.01)
*C04B 41/50* (2006.01)
*C04B 41/52* (2006.01)
*F23R 3/42* (2006.01)

(52) U.S. Cl.
CPC ........ *C04B 41/455* (2013.01); *C04B 41/4523* (2013.01); *C04B 41/4527* (2013.01); *C04B 41/4531* (2013.01); *C04B 41/4584* (2013.01); *C04B 41/4933* (2013.01); *C04B 41/5024* (2013.01); *C04B 41/5027* (2013.01); *C04B 41/52* (2013.01); *F23R 3/42* (2013.01); *C04B 2235/614* (2013.01)

(56) References Cited

U.S. PATENT DOCUMENTS

| | | | | |
|---|---|---|---|---|
| 5,336,350 A | * | 8/1994 | Singh | C04B 38/067 156/155 |
| 10,604,454 B1 | * | 3/2020 | Zhu | C04B 41/5042 |
| 10,807,912 B1 | * | 10/2020 | Zhu | F01D 5/284 |
| 2013/0167374 A1 | * | 7/2013 | Kirby | H04W 4/80 29/888.02 |
| 2016/0024962 A1 | * | 1/2016 | Luthra | C23C 28/048 428/312.6 |
| 2017/0030582 A1 | * | 2/2017 | Razak | F23R 3/50 |
| 2018/0282851 A1 | * | 10/2018 | Ndamka | C04B 41/52 |
| 2021/0017090 A1 | * | 1/2021 | Shi | C04B 41/52 |
| 2021/0331983 A1 | * | 10/2021 | Chen | C04B 35/195 |

FOREIGN PATENT DOCUMENTS

| | | | |
|---|---|---|---|
| CN | 203980349 U | 12/2014 | |
| CN | 106977219 A | 7/2017 | |
| CN | 108794040 A | 11/2018 | |
| CN | 109468568 A | 3/2019 | |
| CN | 111561713 A | 8/2020 | |
| CN | 212029598 U | 11/2020 | |
| WO | WO-2014199459 A1 * | 12/2014 | ........ C04B 35/565 |

\* cited by examiner

AUTOMATED PREPARATION METHOD OF A SIC$_f$/SIC COMPOSITE FLAME TUBE

CROSS-REFERENCE TO RELATED APPLICATIONS

The application claims priority to Chinese patent application No. 201910688219.8, filed on Aug. 15, 2019, the entire contents of which are incorporated herein by reference.

TECHNICAL FIELD

The present disclosure relates to the technical field of aviation structural materials, in particular to an automated preparation method of a SiC$_f$/SiC composite flame tube.

BACKGROUND

Combustion chamber is one of the core components of aero engine. Its main function is to convert the chemical energy of fuel into heat energy through combustion, so as to improve the ability of gas to expand in the turbine and nozzle. In the structural composition of the combustion chamber, the flame tube is the place where the organization burns, and it is a key component to ensure that the air is divided, the combustion is sufficient, the mixing is evenly, and the wall surface is effectively cooled. The reliability, economy and life of the combustion chamber depend to a large extent on the reliability and temperature resistance of the flame tube. Therefore, the development of a high-performance and long-life combustion chamber flame tube plays a vital role in improving engine performance.

The existing silicon carbide fiber-reinforced ceramic matrix (SiC$_f$/SiC) composite material has excellent performance and is the first choice for replacing high-temperature alloys as materials for the hot-end components of aero-engines. However, the stress in the service environment will promote the cracking of the matrix of the composite material, accelerate the damage and corrosion of the material, and affect the long-life requirements of its service in the high-temperature gas environment, thereby seriously restricting the application of SiC$_f$/SiC composite material in the combustion chamber flame tube of the engine. For example, the patent of US20120076927A1 provides a method for improving the mechanical properties of fiber-reinforced silicon-carbon composites. In the patent, by controlling the heat treatment of the composite material, the fiber interface coating and the ceramic matrix are improved, and the excess silicon in the phase matrix can be removed at the same time. However, the present disclosure has very strict limitations on the processing time-temperature-environmental conditions. The heat treatment can even reach a processing temperature of 1900° C., and the processing time can be up to 100 hours in a vacuum or in an inert gas environment with a purity of more than 99%. In addition, although the free silicon can be effectively controlled by adopting the CVI process to prepare the ceramic base, the high density of the material cannot be guaranteed, which is not conducive to the application in the market. Therefore, it is particularly necessary to develop a method for preparing a high-performance SiC$_f$/SiC composite flame tube that can produce high-density at low cost and remove excess silicon at the same time.

In addition, the patent CN106966738B uses a three-dimensional and four-step method to weave the combustion chamber flame tube preform, while the connection part uses fiber stitching technology, and when the flame tube is in a high-temperature gas environment, stress concentration and slight cracks will be formed at the connection part, which will accelerate the damage and corrosion of the material, seriously restricting the performance of the composite flame tube, the temperature change gradient inside the flame tube is large, so the temperature difference will cause stress inside the material, which in turn leads to cracks, and therefore, it is required that the flame tube should have a low thermal expansion coefficient to ensure the dimensional stability of the components when the temperature changes. At the same time, the flame tube should also have high thermal conductivity to avoid flame tube failure due to thermal stress concentration. At the same time, since the current three-dimensional and four-step waving method basically adopts manual knitting method, it has high cost, long construction period and uncontrollable quality. Therefore, the research and development of automated continuous preparation of flame tube preforms plays a vital role in the wide application of SiC$_f$/SiC composites in the flame tube.

SUMMARY

Aiming at the above-mentioned problems existing in the prior art, the present disclosure provides a SiC$_f$/SiC composite flame tube and an automated preparation method of the SiC$_f$/SiC composite flame tube. The prepared SiC$_f$/SiC composite flame tube not only has the high temperature resistance and long life, but also has the low thermal expansion coefficient, high thermal conductivity, high thermal shock resistance and excellent mechanical properties. Meanwhile, the preparation method has high degree of automation, short production cycle, low cost and controllable quality.

An automated preparation method of a SiC$_f$/SiC composite flame tube, comprising the following steps:

1): preparing an interface layer for a SiC fiber by a chemical vapor infiltration process, and obtaining the SiC fiber with a continuous interface layer;

2): laying a unidirectional tape on the SiC fiber with the continuous interface layer obtained in step 1) and winding the SiC fiber with the continuous interface layer obtained in step 1) to form and obtaining a preform of a net size molding according to a fiber volume and a fiber orientation obtained in a simulation calculation;

3): for the preform of the net size molding in step 2), adopting a reactive melt infiltration process and the chemical vapor infiltration process successively for a densification until a mass ratio of a SiC matrix formed by the chemical vapor infiltration process to a SiC matrix formed by the reactive melt infiltration process is 1~1:2;

4): preparing an environmental barrier coating on a surface of the preform of the net size molding obtained in step 3), and a thickness of the environmental barrier coating is 60 um~150 um;

5): preparing a thermal barrier coating on the surface of the preform of the net size molding obtained in step 4), a thickness of the thermal barrier coating is 100 um-150 um, and obtaining a high-density SiC$_f$/SiC composite flame tube in a full intelligent way.

The simulation in the present disclosure includes the finite element analysis method to analyze the temperature field, and the method of combining multi-scale analysis and finite element entity modeling, and according to temperature field analysis, guiding the design of composite flame tube components, fiber volume, fiber orientation, and composite molding methods, etc. to improve the efficiency and accuracy of SiC$_f$/SiC composite flame tube performance prediction, realizing the purpose of automation and high efficiency of the preparation method.

The interface layer in step 1) is one or more of PyC, SiC, B$_4$C, ZrC, HfC, TaC, Si$_3$N$_4$, BN.

The chemical vapor infiltration process in the present disclosure is as the following: choosing a precursor according to an introduced interface layer, hydrogen is a reactant gas and argon is a diluent gas; and introducing the hydrogen and the argon into a chemical vapor infiltration furnace by a bubble method, an infiltration temperature is 500° C.~1400° C., an infiltration pressure is 0.5 KPa~12 KPa, an infiltration time is 60 min-600 min and a thickness of an infiltration interface layer is 100 nm~2 µm. The precursor is one or more of methane, methyltrichlorosilane, boron chloride, zirconium chloride, tantalum chloride, silicon chloride, boron halide and ammonia.

Laying the unidirectional tape on the SiC fiber with the continuous interface layer and winding the SiC fiber with the continuous interface layer to form in step 2), comprising the following steps:

S1: cleaning a surface of a flame tube mold by acetone to a state where no impurities are attached, coating the surface of the flame tube mold evenly with epoxy resin release agent for 2 to 3 times, and heating the flame tube mold to 30° C.~50° C.

S2: laying the SiC fiber with a volume content of 40-65% and a prepreg unidirectional tape with a residual of resin on the surface of the flame tube mold respectively.

S3: winding the SiC fiber with a volume content of 50%-70% and the prepreg unidirectional tape with the residual of resin on the surface of the flame tube mold in S2 through a winding machine, winding from the inside to the outside in a way of a gradient decreasing of a winding tension, a winding angle is 30° ~90°, a winding velocity is 0.3 m/s~0.7 m/s, the winding tension is 2N/cm~10N/cm and a winding thickness is 1~5 mm.

S4: putting the SiC fiber with the volume content of 50%~70% and the prepreg unidirectional tape with the residual of resin wound on the surface of the flame tube mold in S3 into a curing furance for curing and forming, a curing temperature is 90° C.~165° C. and a curing time is 4 hours-8 hours;

S5: demoulding a preform after curing in S4, and then finish processing the preform after curing by a combination of a grinding processing and a laser processing after demolding, and obtaining the preform of the net size molding.

The reactive melt infiltration process in step 3) is specifically a molten silicon infiltration process: devices are a vacuum high temperature atmospheric infiltration furnace and a vacuum high temperature siliconizing furnace, and silicon or silicon alloy is a silicon source, and the argon is the diluent gas, the infiltration temperature is 1450° C.~1800° C., the infiltration pressure is 2 Pa~a normal pressure and a siliconizing time is 30 min-300 min. And the silicon alloy is a binary or a ternary alloy of Ta, Hf, Mo, W, Zr, Ti, B, Be.

The chemical vapor infiltration process in step 3) is specifically as the following: the methyltrichlorosilane is the precursor, the hydrogen is the reactant gas, the argon is the diluent gas, and introducing the hydrogen and the argon into the chemical vapor infiltration furnace by the bubble method, the infiltration temperature is 900° C.~1200° C., the infiltration pressure is 0.5 KPa~5 KPa and the infiltration time is 60 min~6000 min.

The environmental barrier coating in step 4) includes a Si bonding layer, a rare earth monosilicate Re$_2$SiO$_5$ surface layer, and a Yb$_2$Si$_2$O$_7$ intermediate layer located between the Si bonding layer and the rare earth monosilicate Re$_2$SiO$_5$ surface layer; and a thickness ratio of the Si bonding layer, the Yb$_2$Si$_2$O$_7$ intermediate layer and the rare earth monosilicate Re$_2$SiO$_5$ surface layer is 1~2:1~2:1~3; and the rare earth monosilicate Re$_2$SiO$_5$ is selected from at least one of Y$_2$SiO$_5$, Sc$_2$SiO$_5$, Gd$_2$SiO$_5$, Er$_2$SiO$_5$, Tm$_2$SiO$_5$, Yb$_2$SiO$_5$, Lu$_2$SiO$_5$.

The preparation method of the environmental barrier coating, comprising the following steps:

(1): ball milling Yb$_2$Si$_2$O$_7$ and Re$_2$SiO$_5$ respectively until a particle size is 20 um~80 um.

(2): putting the preform into an inert protective atmosphere and heating at 1450° C.~1800° C. for 1 hour~4 hours to form the Si bonding layer.

(3): spraying Yb$_2$Si$_2$O$_7$ powder on the preform with the Si bonding layer by adopting a plasma spraying method to form an intermediate layer.

(4): spraying rare earth monosilicate Re$_2$SiO$_5$ powder on the preform with the bonding layer and the intermediate layer by adopting the plasma spraying method to obtain the environmental barrier coating.

Parameters of the plasma spraying method, comprising: plasma gas includes argon and helium, a flow rate of the argon is from 60 slpm to 80 slpm, the flow rate of the helium is from 40 slpm to 60 slpm, a powder feeding rate is from 10 to 35 r/min, and a spraying distance is from 90 mm to 200 mm.

The thermal barrier coating in step 5) is at least one of R$_2$O$_3$, ZrO$_2$, CeO$_2$, Al$_2$O$_3$.2SiO$_2$, SrZrO$_3$, La$_2$Zr$_2$O$_7$ and La$_2$Ce$_2$O$_7$.

The present disclosure provides a SiC$_f$/SiC composite flame tube.

The beneficial technical effect of the present disclosure is:

(1): the present disclosure introduces an even interface layer between the fiber and the matrix, so that the fiber and the matrix will not be integrated. The layered fiber-interface layer-matrix structure can absorb the energy required for crack propagation, effectively improving the mechanical strength of the composite material; And at the same time, the existence of the ceramic interface layer can protect the SiC fiber from corrosion by oxygen, water vapor, fuel, acid, etc., thereby increasing the use temperature and use environment.

(2): the present disclosure adopts a reactive melt infiltration process (MI) and the chemical vapor infiltration process (CVI) to densificate the ceramic matrix composite material. On the one hand, the MI process is simple and the cycle is short, MI-SiC/SiC has higher density and lower apparent porosity, so the composite material has higher thermal conductivity, especially for the thermal conductivity of the perpendicular fiberdirection, MI-SiC/SiC is more than twice that of CVI-SiC/SiC composites, which is conducive to the improvement of thermal shock resistance. On the other hand, according to experimental data, it is known that the thermal expansion coefficient of MI-SiC/SiC composites is greater than that of CVI-SiC/SiC composites, and by optimizing the process parameters and adjusting the composition and structure of the composite material matrix, the controllability of the material thermal expansion coefficient is realized, and materials with low thermal expansion coefficient and supporting members for space optics are obtained, which effectively reduces the deformation degree caused by uneven heating of the material and improves the service life of SiC$_f$/SiC composite flame tube. Meanwhile, in the present disclosure, the processing temperature in the reactive melt infiltration process is lower than the conventional temperature, which can effectively reduce the silicon content on the surface of the composite material, thereby improving the high temperature resistance of the composite material.

(3): according to the fiber volume and fiber orientation obtained by simulation calculation, the present disclosure adopts the automatic method of unidirectional tape laying and winding to prepare the preform, which makes the three-dimensional preform obtained, the distance between the fiber cloths in the thickness direction is minimized, and the fiber cloths maintain flatness, which not only increases the fiber volume content, but also ensures the even of fiber distribution. The composite flame tube made by the method has the advantages of light weight, high strength, no microcracks, and also has the high temperature resistance, abrasion resistance, and leakage prevention. At the same time, it has high degree of automation, short production cycle, low cost and controllable quality.

(4): the environmental barrier coating in the present disclosure is the Si layer, considering that Si has a higher melting point, so it can ensure that the environmental barrier coating has a higher environmental applicable temperature; and the material of the intermediate layer is $Yb_2Si_2O_7$, considering that the thermal expansion coefficient of $Yb_2Si_2O_7$ is small, which is significantly lower than the thermal expansion coefficient of the rare earth monosilicate $Re_2SiO_5$ surface layer, so that the $Yb_2Si_2O_7$ is not easy to be penetrated by cracks during the thermal cycle, which is beneficial to improve the heat resistance of the coating seismic performance. On the other hand, the rare earth silicate $Re_2SiO_5$ surface layer of the present disclosure has excellent water vapor corrosion resistance, which can further improve the protective performance of the coating system.

(5): in the preparation of the Si layer, the present disclosure adopts a high-temperature reaction heat treatment method to form the Si layer, which can further reduce the silicon content on the surface of the composite material, thereby improving the high temperature resistance of the composite material. On the other hand, by optimizing the heat treatment temperature to increase the grain size of the silicon carbide coating and the density of the coating, a high-temperature resistant, high-density composite flame tube is obtained.

(6): the present disclosure first analyzes the temperature field of the composite flame tube through the finite element method, and then adopts the method of combining multi-scale analysis and finite element solid modeling to combine the meso and macro views to obtain the deterministic load of the structure and the fiber matrix state at load position. And then the present disclosure guides the design of composite flame tube components, fiber volume, fiber orientation, and composite molding methods, which improves the efficiency and accuracy of $SiC_f/SiC$ composite flame tube performance prediction, and realizes the automation and efficiency of the preparation method.

DETAILED DESCRIPTION OF THE EMBODIMENTS

Figure 1:
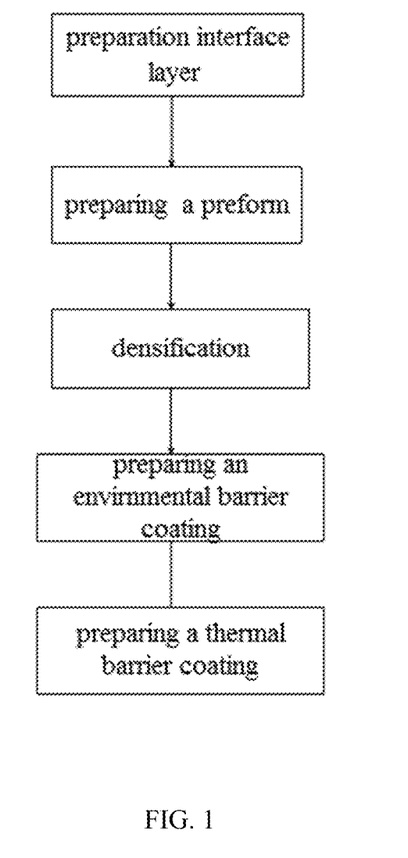
FIG. 1 is a schematic diagram of preparation process of the $SiC_f/SiC$ composite flame tube.
Figure 2:
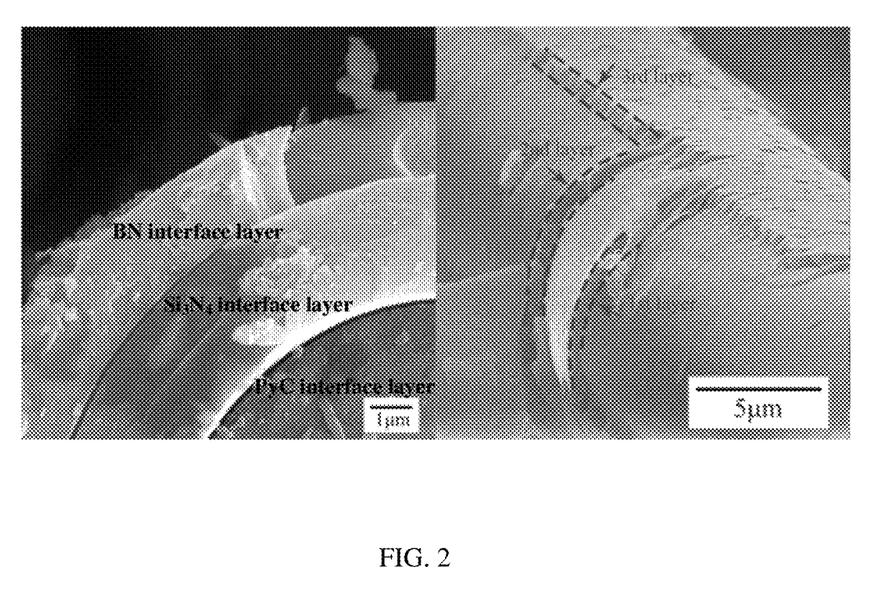
FIG. 2 is a scanning electron micrograph of the PyC/$Si_3N_4$/BN multi-layer interface layer in the embodiment 3.
Figure 3:
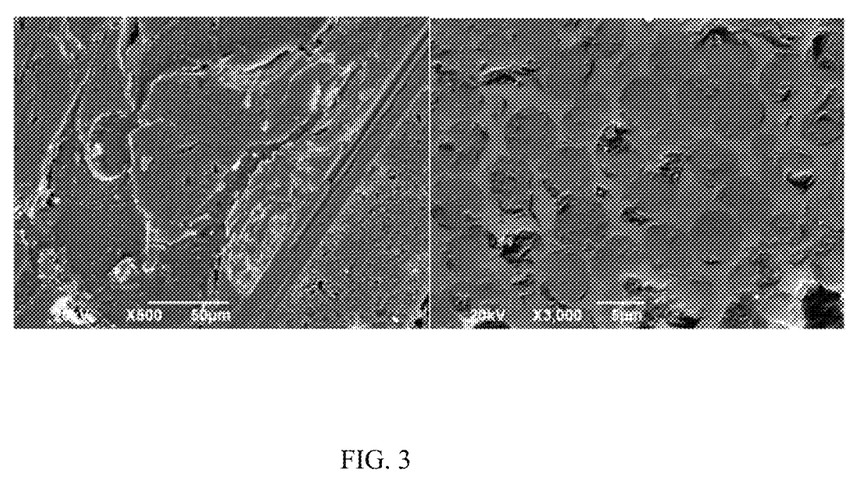
FIG. 3 is a scanning electron micrograph of MI SiC/CVI SiC matrix.
Figure 4:
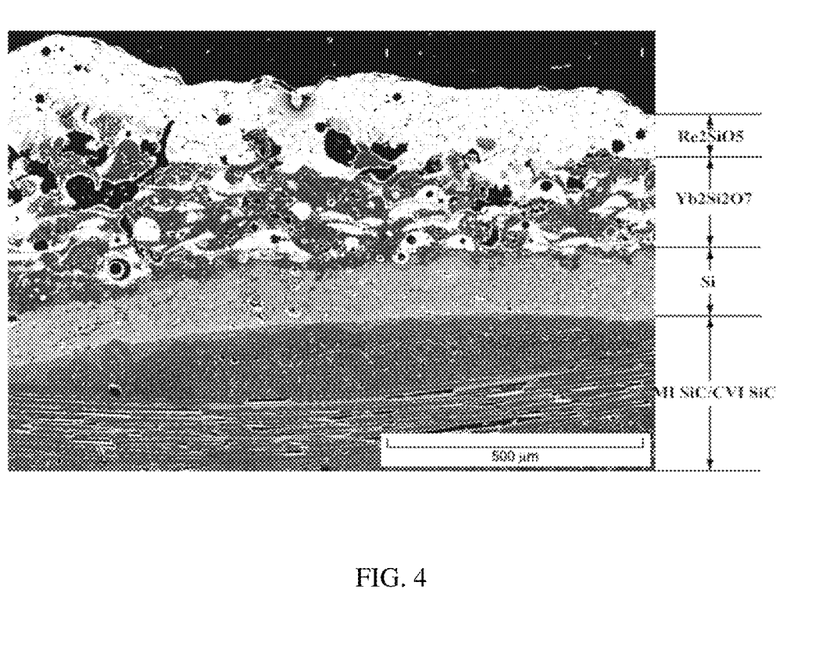
FIG. 4 is a scanning electron micrograph of the environmental barrier coating (EBC)
Figure 5:
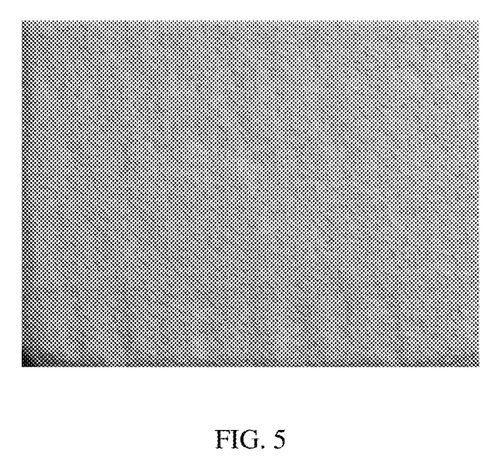
FIG. 5 is the enlarged view of the EBC surface.
Figure 6:
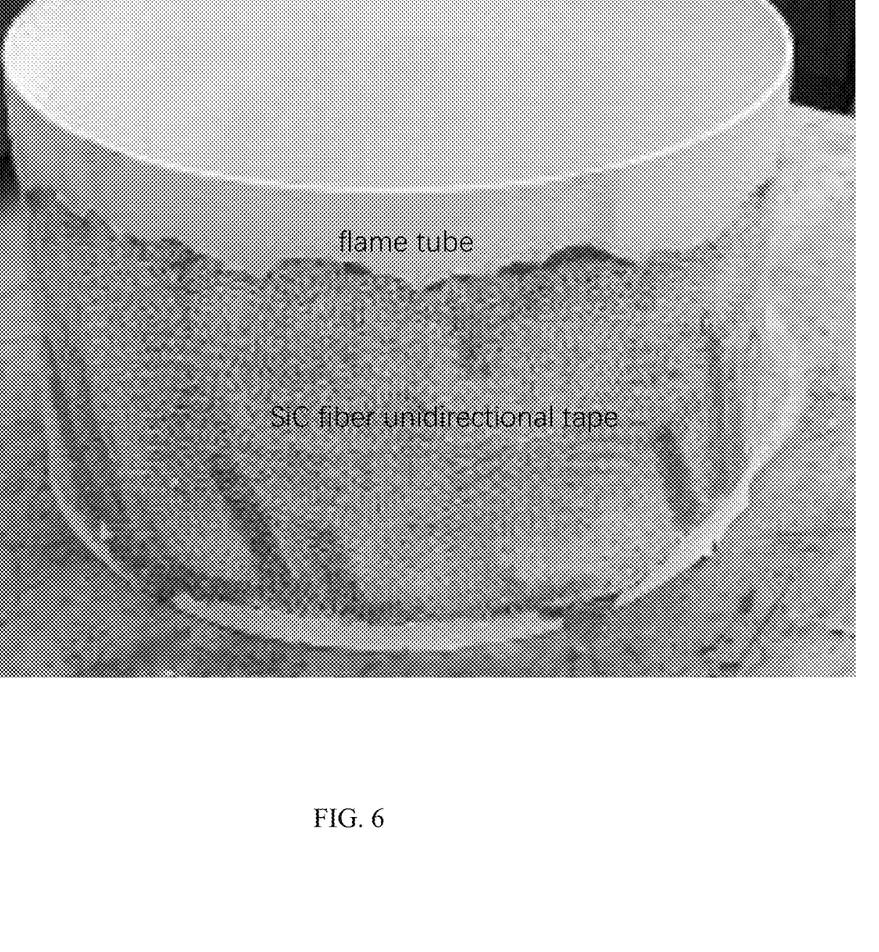
FIG. 6 is a schematic diagram of laying and winding the unidirectional tape in the present disclosure.
Figure 7:
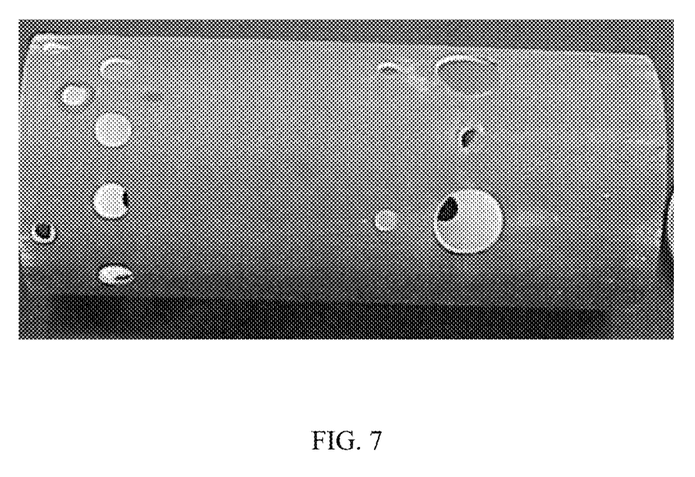
FIG. 7 is a stereograph of the $SiC_f/SiC$ composite flame tube in the present disclosure.

The following describes the present disclosure in detail with reference to the drawings and embodiments. Obviously, the described embodiments are only a part of the embodiments of the present disclosure, rather than all the embodiments. Based on the embodiments of the present disclosure, all other embodiments obtained by those of ordinary skill in the art without creative work shall fall within the protection scope of the present disclosure.

The preparation method of a $SiC_f/SiC$ composite flame tube will be described in detail below in conjunction with specific preferred embodiments.

Embodiment 1

The automated preparation method of the $SiC_f/SiC$ composite flame tube, wherein, comprising the following steps:

1): placing the SiC fiber in an electric resistance furnace at the corresponding chemical vapor infiltration temperature of the PyC interface layer, and making methane as the precursor, hydrogen as the reaction gas, and argon as the dilution gas, introducing the gas is into the chemical vapor infiltration furnace by the bubbling method, and the infiltration temperature is 500° C., the infiltration pressure is 12 KPa, the infiltration time is 600 min and the thickness of an infiltration interface layer is 100 nm; and after the SiC fiber cooling in the furnace, SiC fiber with continuous PyC interface layer is obtained;

2): laying a unidirectional tape on the SiC fiber with the continuous interface layer obtained in step 1) and winding the SiC fiber with the continuous interface layer obtained in step 1) according to a fiber volume and a fiber orientation obtained in a simulation calculation, comprising the following steps:

S1: cleaning a surface of a flame tube mold by acetone to a state where no impurities are attached, coating the surface of the flame tube mold evenly with epoxy resin release agent for 2 times, and heating the flame tube mold to 30° C.;

S2: laying the SiC fiber with a volume content of 40% and a prepreg unidirectional tape with a residual of resin on the surface of the flame tube mold respectively;

S3: winding the SiC fiber with a volume content of 50% and the prepreg unidirectional tape with the residual of resin on the surface of the flame tube mold in S2 through a winding machine, winding from the inside to the outside in a way of a gradient decreasing of a winding tension, a winding angle is 30°, a winding velocity is 0.3 m/s, the winding tension is 2N/cm and a winding thickness is 1 mm;

S4: putting the SiC fiber with the volume content of 50% and the prepreg unidirectional tape with the residual of resin wound on the surface of the flame tube mold in S3 into a curing furnace for curing and forming, a curing temperature is 90° C. and a curing time is 4 hours;

S5: demoulding a preform after curing in S4, and then finish processing the preform after curing by a combination of a grinding processing and a laser processing after demolding, and obtaining the preform of the net size molding.

3): for the preform of the net size molding in step 2), adopting a reactive melt infiltration process and the chemical vapor infiltration process successively for a densification.

Carrying out low-temperature vacuum siliconizing first, and regarding the binary alloy of Si and Ta as the silicon source, and the argon is the diluent gas, the infiltration temperature is 1400° C., the infiltration pressure is normal pressure and the siliconizing time is 300 min, after cooling with the furnace, repeating the step once. And then, carrying out the chemical vapor infiltration, and the methyltrichlorosilane is the precursor, the hydrogen is the reactant gas, the argon is the diluent gas, and introducing the hydrogen and the argon into the chemical vapor infiltration furnace by the bubble method, the infiltration temperature is 900° C., the infiltration pressure is 5 KPa and the infiltration time is 6000 min, after cooling with the furnace, repeating the step once until the mass ratio of the SiC matrix formed by the chemical vapor infiltration process to the SiC matrix formed by the reactive melt infiltration process is 1:1.

4): preparing a 60 um-thick environmental barrier coating on the surface of the preform obtained in step 3), the preparation method of the environmental barrier coating, comprising the following steps:

(1): ball milling $Yb_2Si_2O_7$ and $Re_2SiO_5$ respectively until the particle size is 20 um;

(2): putting the preform into an inert protective atmosphere and heating at 1450° C. for 4 hours to form the Si bonding layer;

(3): preparing the intermediate layer and the surface layer according to the thickness ratio of the Si bonding layer, the $Yb_2Si_2O_7$ intermediate layer and the rare earth monosilicate $Re_2SiO_5$ surface layer of 1:1:1 by adopting the plasma spraying method. As for the plasma spraying method, plasma gas includes argon and helium, the flow rate of the argon is 60 slpm, the flow rate of the helium is 40 slpm, the powder feeding rate is 10 r/min, and a spraying distance is 90 mm And spraying $Yb_2Si_2O_7$ powder and $Yb_2Si_2O_5$ powder on the preform in turn to obtain a high-density and fully intelligent $SiC_f/SiC$ composite flame tube.

5): preparing the thermal barrier coating on the surface of the preform obtained in step 4), and the thermal barrier coating is $R_2O_3$—$Al_2O_3$, whose thickness is 100 um, and obtaining a high-density $SiC_f/SiC$ composite flame tube in a full intelligent way.

Embodiment 2

The automated preparation method of the $SiC_f/SiC$ composite flame tube, wherein, comprising the following steps:

1): placing the SiC fiber in an electric resistance furnace at the corresponding chemical vapor infiltration temperature of the PyC interface layer, and making methane as the precursor, hydrogen as the reaction gas, and argon as the dilution gas, introducing the gas is into the chemical vapor infiltration furnace by the bubbling method, and the infiltration temperature is 1400° C., the infiltration pressure is 0.5 KPa, the infiltration time is 60 min and the thickness of an infiltration interface layer is 2 um; and after the SiC fiber cooling in the furnace, SiC fiber with continuous interface layer is obtained.

2): laying a unidirectional tape on the SiC fiber with the continuous interface layer obtained in step 1) and winding the SiC fiber with the continuous interface layer obtained in step 1) according to a fiber volume and a fiber orientation obtained in a simulation calculation, comprising the following steps:

S1: cleaning a surface of a flame tube mold by acetone to a state where no impurities are attached, coating the surface of the flame tube mold evenly with epoxy resin release agent for 3 times, and heating the flame tube mold to 50° C.;

S2: laying the SiC fiber with a volume content of 65% and a prepreg unidirectional tape with a residual of resin on the surface of the flame tube mold respectively;

S3: winding the SiC fiber with a volume content of 70% and the prepreg unidirectional tape with the residual of resin on the surface of the flame tube mold in S2 through a winding machine, winding from the inside to the outside in a way of a gradient decreasing of a winding tension, a winding angle is 90°, a winding velocity is 0.7 m/s, the winding tension is 10N/cm and a winding thickness is 5 mm;

S4: putting the SiC fiber with the volume content of 70% and the prepreg unidirectional tape with the residual of resin wound on the surface of the flame tube mold in S3 into a curing furnace for curing and forming, a curing temperature is 165° C. and the curing time is 8 h;

S5: demoulding a preform after curing in S4, and then finish processing the preform after curing by a combination of a grinding processing and a laser processing after demolding, and obtaining the preform of the net size molding.

3): for the preform of the net size molding in step 2), adopting the reactive melt infiltration process and the chemical vapor infiltration process successively for a densification. Carrying out low-temperature vacuum siliconizing first, and regarding the binary alloy of Si and Ta as the silicon source, and the argon is the diluent gas, the infiltration temperature is 1800° C., the infiltration pressure is 2 Pa and the siliconizing time is 30 min, after cooling with the furnace, repeating the step once. And then, carrying out the chemical vapor infiltration, and the methyltrichlorosilane is the precursor, the hydrogen is the reactant gas, the argon is the diluent gas, and introducing the hydrogen and the argon into the chemical vapor infiltration furnace by the bubble method, the infiltration temperature is 1200° C., the infiltration pressure is 0.5 KPa and the infiltration time is 60 min, after cooling with the furnace, repeating the step once until the mass ratio of the SiC matrix formed by the chemical vapor infiltration process to the SiC matrix formed by the reactive melt infiltration process is 1:2.

4): preparing a 150 um-thick environmental barrier coating on the surface of the preform obtained in step 3), the preparation method of the environmental barrier coating, comprising the following steps:

(1): ball milling $Yb_2Si_2O_7$ and $Re_2SiO_5$ respectively until the particle size is 80 um;

(2): putting the preform into an inert protective atmosphere and heating at 1800° C. for 1 h to form the Si bonding layer;

(3): preparing the intermediate layer and the surface layer according to the thickness ratio of the Si bonding layer, the $Yb_2Si_2O_7$ intermediate layer and the rare earth monosilicate $Re_2SiO_5$ surface layer of 2:2:3 by adopting the plasma spraying method. As for the plasma spraying method, plasma gas includes argon and helium, the flow rate of the argon is 80 slpm, the flow rate of the helium is 60 slpm, the powder feeding rate is 35 r/min, and a spraying distance is 200 mm And spraying $Yb_2Si_2O_7$ powder and $Yb_2Si_2O_5$ powder on the preform in turn to obtain a high-density and fully intelligent $SiC_f/SiC$ composite flame tube.

5): preparing the thermal barrier coating on the surface of the preform obtained in step 4), and the thermal barrier coating is $R_2O_3$—$Al_2O_3$, whose thickness is 150 um, and obtaining a high-density $SiC_f/SiC$ composite flame tube in a full intelligent way.

Embodiment 3

The automated preparation method of the $SiC_f/SiC$ composite flame tube, wherein, comprising the following steps:

1): placing the SiC fiber in an electric resistance furnace at the corresponding chemical vapor infiltration temperature of the PyC interface layer, and making methane as the precursor, hydrogen as the reaction gas, and argon as the dilution gas, and introducing the gas is into the chemical vapor infiltration furnace by the bubbling method, and the infiltration temperature is 1000° C., the infiltration pressure is 8 KPa, the infiltration time is 300 min and the thickness of an infiltration interface layer is 1 um; and after the SiC fiber cooling in the furnace, SiC fiber with continuous interface layer is obtained.

2): laying a unidirectional tape on the SiC fiber with the continuous interface layer obtained in step 1) and winding the SiC fiber with the continuous interface layer obtained in step 1) according to a fiber volume and a fiber orientation obtained in a simulation calculation, comprising the following steps:

S1: cleaning a surface of a flame tube mold by acetone to a state where no impurities are attached, coating the surface of the flame tube mold evenly with epoxy resin release agent for 2 times, and heating the flame tube mold to 40° C.;

S2: laying the SiC fiber with a volume content of 55% and a prepreg unidirectional tape with a residual of resin on the surface of the flame tube mold respectively;

S3: winding the SiC fiber with a volume content of 60% and the prepreg unidirectional tape with the residual of resin on the surface of the flame tube mold in S2 through a winding machine, winding from the inside to the outside in a way of a gradient decreasing of a winding tension, a winding angle is 60°, a winding velocity is 0.5 m/s, the winding tension is 6N/cm and a winding thickness is 3 mm;

S4: putting the SiC fiber with the volume content of 70% and the prepreg unidirectional tape with the residual of resin wound on the surface of the flame tube mold in S3 into a curing furnace for curing and forming, a curing temperature is 120° C. and the curing time is 6 hours;

S5: demoulding a preform after curing in S4, and then finish processing the preform after curing by a combination of a grinding processing and a laser processing after demolding, and obtaining the preform of the net size molding.

3): for the preform of the net size molding in step 2), adopting the reactive melt infiltration process and the chemical vapor infiltration process successively for a densification. Carrying out low-temperature vacuum siliconizing first, and regarding the binary alloy of Si and Ta as the silicon source, and the argon is the diluent gas, the infiltration temperature is 1600° C., the infiltration pressure is 1 Pa and the siliconizing time is 180 min, after cooling with the furnace, repeating the step once. And then, carrying out the chemical vapor infiltration, and the methyltrichlorosilane is the precursor, the hydrogen is the reactant gas, the argon is the diluent gas, and introducing the hydrogen and the argon into the chemical vapor infiltration furnace by the bubble method, the infiltration temperature is 1000° C., the infiltration pressure is 3 KPa and the infiltration time is 4800 min, after cooling with the furnace, repeating the step once until the mass ratio of the SiC matrix formed by the chemical vapor infiltration process to the SiC matrix formed by the reactive melt infiltration process is 1:1.5.

4): preparing a 100 um-thick environmental barrier coating on the surface of the preform obtained in step 3), the preparation method of the environmental barrier coating, comprising the following steps:

(1): ball milling $Yb_2Si_2O_7$ and $Re_2SiO_5$ respectively until the particle size is 50 um;

(2): putting the preform into an inert protective atmosphere and heating at 1600° C. for 3 h to form the Si bonding layer;

(3): preparing the intermediate layer and the surface layer according to the thickness ratio of the Si bonding layer, the $Yb_2Si_2O_7$ intermediate layer and the rare earth monosilicate $Re_2SiO_5$ surface layer of 1:2:1 by adopting the plasma spraying method. As for the plasma spraying method, plasma gas includes argon and helium, the flow rate of the argon is 70 slpm, the flow rate of the helium is 50 slpm, the powder feeding rate is 20 r/min, and a spraying distance is 120 mm And spraying $Yb_2Si_2O_7$ powder and $Yb_2Si_2O_5$ powder on the preform in turn to obtain a high-density and fully intelligent $SiC_f/SiC$ composite flame tube.

5): preparing the thermal barrier coating on the surface of the preform obtained in step 4), and the thermal barrier coating is $R_2O_3$—$Al_2O_3$, whose thickness is 120 um, and obtaining a high-density $SiC_f/SiC$ composite flame tube in a full intelligent way.

Embodiment 4

The automated preparation method of the $SiC_f/SiC$ composite flame tube, wherein, comprising the following steps:

1): placing the SiC fiber in an electric resistance furnace at the corresponding chemical vapor infiltration temperature of the PyC interface layer, $Si_3N_4$ interface layer and BN interface layer, and introducing $PyC/Si_3N_4/BN$ multi-interface layer, specifically introducing the PyC interface layer. In the PyC interface layer, making methane as the precursor, hydrogen as the reaction gas, and argon as the dilution gas, introducing the gas is into the chemical vapor infiltration furnace by the bubbling method, and the infiltration temperature is 500° C., the infiltration pressure is 12 KPa, the infiltration time is 600 min and the thickness of an infiltration interface layer is 100 nm; and in the $Si_3N_4$ interface layer, making Trichloromethylsilane and ammonia gas as precursors, hydrogen as the reaction gas, and argon as the dilution gas, and introducing the gas is into the chemical vapor infiltration furnace by the bubbling method, and the infiltration temperature is 500° C., the infiltration pressure is 0.5 KPa, the infiltration time is 600 min and the thickness of an infiltration interface layer is 100 nm; and in the BN interface layer, making boron chloride and ammonia as precursors, hydrogen as the reaction gas, and argon as the dilution gas, and introducing the gas is into the chemical vapor infiltration furnace by the bubbling method, and the infiltration temperature is 500° C., the infiltration pressure is 12 KPa, the infiltration time is 600 min and the thickness of an infiltration interface layer is 100 nm; and after the SiC fiber cooling in the furnace, SiC fiber with multi-layer continuous interface layer is obtained.

2): laying a unidirectional tape on the SiC fiber with the continuous interface layer obtained in step 1) and winding the SiC fiber with the continuous interface layer obtained in step 1) according to a fiber volume and a fiber orientation obtained in a simulation calculation, comprising the following steps:

S1: cleaning a surface of a flame tube mold by acetone to a state where no impurities are attached, coating the surface of the flame tube mold evenly with epoxy resin release agent for 2 times, and heating the flame tube mold to 30° C.;

S2: laying the SiC fiber with a volume content of 40% and a prepreg unidirectional tape with a residual of resin on the surface of the flame tube mold respectively;

S3: winding the SiC fiber with a volume content of 50% and the prepreg unidirectional tape with the residual of resin on the surface of the flame tube mold in S2 through a winding machine, winding from the inside to the outside in a way of a gradient decreasing of a winding tension, a winding angle is 30°, a winding velocity is 0.3 m/s, the winding tension is 2N/cm and a winding thickness is 1 mm;

S4: putting the SiC fiber with the volume content of 50% and the prepreg unidirectional tape with the residual of resin wound on the surface of the flame tube mold in S3 into a curing furnace for curing and forming, a curing temperature is 90° C. and the curing time is 4 hours;

S5: demoulding a preform after curing in S4, and then finish processing the preform after curing by a combination of a grinding processing and a laser processing after demolding, and obtaining the preform of the net size molding.

3): for the preform of the net size molding in step 2), adopting the reactive melt infiltration process and the chemical vapor infiltration process successively for a densification. Carrying out low-temperature vacuum siliconizing first, and regarding the binary alloy of Si and Ta as the silicon source, and the argon is the diluent gas, the infiltration temperature is 1400° C., the infiltration pressure is 2 Pa and the siliconizing time is 300 min, after cooling with the furnace, repeating the step once. And then, carrying out the chemical vapor infiltration, and the methyltrichlorosilane is the precursor, the hydrogen is the reactant gas, the argon is the diluent gas, and introducing the hydrogen and the argon into the chemical vapor infiltration furnace by the bubble method, the infiltration temperature is 900° C., the infiltration pressure is 5 KPa and the infiltration time is 60 min, after cooling with the furnace, repeating the step once until the mass ratio of the SiC matrix formed by the chemical vapor infiltration process to the SiC matrix formed by the reactive melt infiltration process is 1:1.

4): preparing a 60 um-thick environmental barrier coating on the surface of the preform obtained in step 3), the preparation method of the environmental barrier coating, comprising the following steps:

(1): ball milling $Yb_2Si_2O_7$ and $Re_2SiO_5$ respectively until the particle size is 20 um;

(2): putting the preform into an inert protective atmosphere and heating at 1450° C. for 4 hours to form the Si bonding layer;

(3): preparing the intermediate layer and the surface layer according to the thickness ratio of the Si bonding layer, the $Yb_2Si_2O_7$ intermediate layer and the rare earth monosilicate $Re_2SiO_5$ surface layer of 1:1:1 by adopting the plasma spraying method. As for the plasma spraying method, plasma gas includes argon and helium, the flow rate of the argon is 60 slpm, the flow rate of the helium is 40 slpm, the powder feeding rate is 10 r/min, and a spraying distance is 90 mm And spraying $Yb_2Si_2O_7$ powder and $Yb_2Si_2O_5$ powder on the preform in turn to obtain a high-density and fully intelligent $SiC_f$/SiC composite flame tube.

5): preparing the thermal barrier coating on the surface of the preform obtained in step 4), and the thermal barrier coating is $R_2O_3$—$ZrO_2$—$CeO_2$, whose thickness is 100 um, and obtaining a high-density $SiC_f$/SiC composite flame tube in a full intelligent way.

Embodiment 5

The automated preparation method of the $SiC_f$/SiC composite flame tube, wherein, comprising the following steps:

1): placing the SiC fiber in an electric resistance furnace at the corresponding chemical vapor infiltration temperature of the PyC interface layer, $Si_3N_4$ interface layer and BN interface layer, and introducing PyC/$Si_3N_4$/BN multi-interface layer, specifically introducing the PyC interface layer. In the PyC interface layer, making methane as the precursor, hydrogen as the reaction gas, and argon as the dilution gas, introducing the gas is into the chemical vapor infiltration furnace by the bubbling method, and the infiltration temperature is 1400° C., the infiltration pressure is 0.5 KPa, the infiltration time is 60 min and the thickness of an infiltration interface layer is 2 um; and in the $Si_3N_4$ interface layer, making Trichloromethylsilane and ammonia gas as precursors, hydrogen as the reaction gas, and argon as the dilution gas, and introducing the gas is into the chemical vapor infiltration furnace by the bubbling method, and the infiltration temperature is 1400° C., the infiltration pressure is 0.5 KPa, the infiltration time is 60 min and the thickness of an infiltration interface layer is 2 um; and in the BN interface layer, making boron chloride and ammonia as precursors, hydrogen as the reaction gas, and argon as the dilution gas, and introducing the gas is into the chemical vapor infiltration furnace by the bubbling method, and the infiltration temperature is 1400° C., the infiltration pressure is 0.5 KPa, the infiltration time is 60 min and the thickness of an infiltration interface layer is 2 um; and after the SiC fiber cooling in the furnace, SiC fiber with multi-layer continuous interface layer is obtained.

2): laying a unidirectional tape on the SiC fiber with the continuous interface layer obtained in step 1) and winding the SiC fiber with the continuous interface layer obtained in step 1) according to a fiber volume and a fiber orientation obtained in a simulation calculation, comprising the following steps:

S1: cleaning a surface of a flame tube mold by acetone to a state where no impurities are attached, coating the surface of the flame tube mold evenly with epoxy resin release agent for 2 times, and heating the flame tube mold to 50° C.;

S2: laying the SiC fiber with a volume content of 65% and a prepreg unidirectional tape with a residual of resin on the surface of the flame tube mold respectively;

S3: winding the SiC fiber with a volume content of 70% and the prepreg unidirectional tape with the residual of resin on the surface of the flame tube mold in S2 through a winding machine, winding from the inside to the outside in a way of a gradient decreasing of a winding tension, a winding angle is 90°, a winding velocity is 0.7 m/s, the winding tension is 10N/cm and a winding thickness is 5 mm;

S4: putting the SiC fiber with the volume content of 70% and the prepreg unidirectional tape with the residual of resin wound on the surface of the flame tube mold in S3 into a curing furnace for curing and forming, a curing temperature is 90° C. and the curing time is 4 hours;

S5: demoulding a preform after curing in S4, and then finish processing the preform after curing by a combination of a grinding processing and a laser processing after demolding, and obtaining the preform of the net size molding.

3): for the preform of the net size molding in step 2), adopting the reactive melt infiltration process and the chemical vapor infiltration process successively for a densification. Carrying out low-temperature vacuum siliconizing first, and regarding the binary alloy of Si and Ta as the silicon source, and the argon is the diluent gas, the infiltration temperature is 1800° C., the infiltration pressure is normal pressure and the siliconizing time is 30 min, after cooling with the furnace, repeating the step once. And then, carrying out the chemical vapor infiltration, and the methyltrichlorosilane is the precursor, the hydrogen is the reactant gas, the argon is the diluent gas, and introducing the hydrogen and the argon into the chemical vapor infiltration furnace by the bubble method, the infiltration temperature is 1200° C., the infiltration pressure is 0.5 KPa and the infiltration time is 6000 min, after cooling with the furnace, repeating the step once until the mass ratio of the SiC matrix formed by the chemical vapor infiltration process to the SiC matrix formed by the reactive melt infiltration process is 1:2.

4): preparing a 150 um-thick environmental barrier coating on the surface of the preform obtained in step 3), the preparation method of the environmental barrier coating, comprising the following steps:

(1): ball milling $Yb_2Si_2O_7$ and $Re_2SiO_5$ respectively until the particle size is 80 um;

(2): putting the preform into an inert protective atmosphere and heating at 1800° C. for 1 h to form the Si bonding layer;

(3): preparing the intermediate layer and the surface layer according to the thickness ratio of the Si bonding layer, the $Yb_2Si_2O_7$ intermediate layer and the rare earth monosilicate $Re_2SiO_5$ surface layer of 2:2:3 by adopting the plasma spraying method. As for the plasma spraying method, plasma gas includes argon and helium, the flow rate of the argon is 80 slpm, the flow rate of the helium is 60 slpm, the powder feeding rate is 35 r/min, and a spraying distance is 200 mm And spraying $Yb_2Si_2O_7$ powder and $Yb_2Si_2O_5$ powder on the preform in turn to obtain a high-density and fully intelligent $SiC_f/SiC$ composite flame tube.

(5): preparing the thermal barrier coating on the surface of the preform obtained in step 4), and the thermal barrier coating is $R_2O_3$—$ZrO_2$—$CeO_2$, whose thickness is 150 um, and obtaining a high-density $SiC_f/SiC$ composite flame tube in a full intelligent way.

Embodiment 6

The automated preparation method of the $SiC_f/SiC$ composite flame tube, wherein, comprising the following steps:

1): placing the SiC fiber in an electric resistance furnace at the corresponding chemical vapor infiltration temperature of the PyC interface layer, $Si_3N_4$ interface layer and BN interface layer, and introducing $PyC/Si_3N_4/BN$ multi-interface layer, specifically introducing the PyC interface layer. In the PyC interface layer, making methane as the precursor, hydrogen as the reaction gas, and argon as the dilution gas, introducing the gas is into the chemical vapor infiltration furnace by the bubbling method, and the infiltration temperature is 1000° C., the infiltration pressure is 8 KPa, the infiltration time is 300 min and the thickness of an infiltration interface layer is 1 um; and in the $Si_3N_4$ interface layer, making Trichloromethylsilane and ammonia gas as precursors, hydrogen as the reaction gas, and argon as the dilution gas, and introducing the gas is into the chemical vapor infiltration furnace by the bubbling method, and the infiltration temperature is 1000° C., the infiltration pressure is 8 KPa, the infiltration time is 300 min and the thickness of an infiltration interface layer is 1 um; and in the BN interface layer, making boron chloride and ammonia as precursors, hydrogen as the reaction gas, and argon as the dilution gas, and introducing the gas is into the chemical vapor infiltration furnace by the bubbling method, and the infiltration temperature is 1000° C., the infiltration pressure is 8 KPa, the infiltration time is 300 min and the thickness of an infiltration interface layer is 1 um; and after the SiC fiber cooling in the furnace, SiC fiber with multi-layer continuous interface layer is obtained.

2): laying a unidirectional tape on the SiC fiber with the continuous interface layer obtained in step 1) and winding the SiC fiber with the continuous interface layer obtained in step 1) according to a fiber volume and a fiber orientation obtained in a simulation calculation, comprising the following steps:

S1: cleaning a surface of a flame tube mold by acetone to a state where no impurities are attached, coating the surface of the flame tube mold evenly with epoxy resin release agent for 2 times, and heating the flame tube mold to 40° C.;

S2: laying the SiC fiber with a volume content of 55% and a prepreg unidirectional tape with a residual of resin on the surface of the flame tube mold respectively;

S3: winding the SiC fiber with a volume content of 60% and the prepreg unidirectional tape with the residual of resin on the surface of the flame tube mold in S2 through a winding machine, winding from the inside to the outside in a way of a gradient decreasing of a winding tension, a winding angle is 60°, a winding velocity is 0.5 m/s, the winding tension is 6N/cm and a winding thickness is 3 mm;

S4: putting the SiC fiber with the volume content of 60% and the prepreg unidirectional tape with the residual of resin wound on the surface of the flame tube mold in S3 into a curing furnace for curing and forming, a curing temperature is 120° C. and the curing time is 6 hours;

S5: demoulding a preform after curing in S4, and then finish processing the preform after curing by a combination of a grinding processing and a laser processing after demolding, and obtaining the preform of the net size molding.

3): for the preform of the net size molding in step 2), adopting the reactive melt infiltration process and the chemical vapor infiltration process successively for a densification. Carrying out low-temperature vacuum siliconizing first, and regarding the binary alloy of Si and Ta as the silicon source, and the argon is the diluent gas, the infiltration temperature is 1600° C., the infiltration pressure is 1 Pa and the siliconizing time is 180 min, after cooling with the furnace, repeating the step once. And then, carrying out the chemical vapor infiltration, and the methyltrichlorosilane is the precursor, the hydrogen is the reactant gas, the argon is the diluent gas, and introducing the hydrogen and the argon into the chemical vapor infiltration furnace by the bubble method, the infiltration temperature is 1000° C., the infiltration pressure is 3 KPa and the infiltration time is 4800 min, after cooling with the furnace, repeating the step once until the mass ratio of the SiC matrix formed by the chemical vapor infiltration process to the SiC matrix formed by the reactive melt infiltration process is 1:1.5.

4): preparing a 100 um-thick environmental barrier coating on the surface of the preform obtained in step 3), the preparation method of the environmental barrier coating, comprising the following steps:

(1): ball milling $Yb_2Si_2O_7$ and $Re_2SiO_5$ respectively until the particle size is 60 um;

(2): putting the preform into an inert protective atmosphere and heating at 1600° C. for 2 h to form the Si bonding layer;

(3): preparing the intermediate layer and the surface layer according to the thickness ratio of the Si bonding layer, the $Yb_2Si_2O_7$ intermediate layer and the rare earth monosilicate $Re_2SiO_5$ surface layer of 1:2:1 by adopting the plasma spraying method. As for the plasma spraying method, plasma gas includes argon and helium, the flow rate of the argon is 70 slpm, the flow rate of the helium is 50 slpm, the powder feeding rate is 20 r/min, and a spraying distance is 150 mm And spraying $Yb_2Si_2O_7$ powder and $Yb_2Si_2O_5$ powder on the preform in turn to obtain a high-density and fully intelligent $SiC_f/SiC$ composite flame tube.

(5): preparing the thermal barrier coating on the surface of the preform obtained in step 4), and the thermal barrier coating is $R_2O_3$—$ZrO_2$—$CeO_2$, whose thickness is 120 um, and obtaining a high-density SiC$_f$/SiC composite flame tube in a full intelligent way.

Test Embodiment

Carrying out the performance test of the SiC$_f$/SiC composite flame tube prepared in embodiment 1 to embodiment 6, and a conventional flame tube was used as a comparative example, and the details are as follows:

1. High Temperature Oxidation Resistance

Test method: samples were taken from the SiC$_f$/SiC composite flame tube prepared in embodiment 1 to embodiment 6, and made into mechanical properties parts with a size of 3×4×40 (mm), and then process the piece in aerobic environment, normal temperature and high temperature environment for 500 h, among which the high temperature environment was 1400° C. and 1600° C. respectively.

Test result: the test results of bending strength are shown in Table 1 below:

TABLE 1 bending strength of SiC$_f$/SiC composite flame tube at different temperatures:

| | Bending strength(MPa) | | |
| --- | --- | --- | --- |
| | normal pressure | 1400° C. | 1600° C. |
| Embodiment 1 | 823 | 617 | 431 |
| Embodiment 2 | 836 | 624 | 426 |
| Embodiment 3 | 829 | 614 | 435 |
| Embodiment 4 | 854 | 626 | 415 |
| Embodiment 5 | 848 | 618 | 424 |
| Embodiment 6 | 839 | 622 | 421 |
| Contrast ratio | 716 | 523 | 293 |

2. Density and Porosity

Test method: the SiC$_f$/SiC composite flame tube prepared in embodiment 1 to embodiment 6 were tested according to GB/T 1966-1996 "Test Method for Apparent Porosity and Capacity of Porous Ceramics".

Test result: the volume density of the prepared SiC$_f$/SiC composite flame tube is 2.75 g/m3, and the apparent porosity is 0.65%.

3. Thermal and Seismic Resistance Performance

Test method: cutting the specimens on the SiC$_f$/SiC composite flame tube prepared in Examples 1 to 6, and place them in a completely enclosed space, respectively, and heat them to 1100° C., 1200° C., and 1300° C., and then placing them in 20° C. water, repeating the heating and cooling process, and visually check whether there is cracking.

Test result: the thermal and seismic resistance performance of the SiC$_f$/SiC composite flame tube is shown in Table 2 below:

TABLE 2 thermal and seismic resistance performance of SiC$_f$/SiC composite flame tube at different temperatures:

| | Thermal and seismic resistance performance | | |
| --- | --- | --- | --- |
| | 1100° C. | 1200° C. | 1300° C. |
| Embodiment 1 | 786 | 685 | 145 |
| Embodiment 2 | 779 | 688 | 151 |
| Embodiment 3 | 791 | 679 | 147 |

TABLE 2-continued thermal and seismic resistance performance of SiC$_f$/SiC composite flame tube at different temperatures:

| | Thermal and seismic resistance performance | | |
| --- | --- | --- | --- |
| | 1100° C. | 1200° C. | 1300° C. |
| Embodiment 4 | 789 | 683 | 152 |
| Embodiment 5 | 794 | 690 | 143 |
| Embodiment 6 | 790 | 687 | 148 |
| Contrast ratio | 347 | 163 | 31 |

The pros and cons of thermal and seismic resistance performance are expressed by the number of heating and cooling treatments, that is, the more times, the better the thermal and seismic resistance performance. It can be seen from Table 2 that the thermal and seismic resistance performance of the embodiment 1 to embodiment 6 is more excellent.

4. Thermal Conductivity

Test method: testing the SiC$_f$/SiC composite flame tube according to GB/T 17911.8-2002 "Test Method for Thermal Conductivity of Refractory Ceramic Fiber Products".

Test method: the average thermal conductivity of the prepared SiC$_f$/SiC composite flame tube is 30 W/(m·K).

5. Coefficient of Thermal Expansion

Test method: testing the SiC$_f$/SiC composite flame tube according to GB/T16535-1996 "Test Method for Thermal Expansion Coefficient of Engineering Ceramics".

Test result: the coefficient of thermal expansion of the prepared SiC$_f$/SiC composite flame tube is $3.65 \times 10^{-6}$ m/K.

Although the embodiments of the present disclosure have been disclosed above, the present disclosure is not limited to the applications listed in the specification and embodiments, and it can be applied to various fields suitable for the present disclosure. For those skilled in the art, for those of ordinary skill in the art, various changes, modifications, substitutions and modifications can be made to these embodiments without departing from the principles of the present disclosure, and therefore, without departing from the rights under the general concept defined by the requirements and equivalent scope, the present disclosure is not limited to specific details.

What is claimed is:

1. A method for the preparation of a silicon carbide ceramic (SiC$_f$/SiC) matrix composite flame tube, comprising the steps of:
   1) preparing an interface layer for a SiC fiber by a chemical vapor infiltration process, and obtaining the SiC fiber having a continuous interface layer;
   2) laying a prepreg unidirectional tape on the SiC fiber having the continuous interface layer obtained in step 1) and winding the SiC fiber having the continuous interface layer obtained in step 1) to form and obtain a preform of a net size molding;
   3) performing densification on the preform obtained in step 2) by adopting a reactive melt infiltration (RMI) process and a chemical vapor infiltration process in sequence until the mass ratio of a SiC matrix formed by the chemical vapor infiltration process to a SiC matrix formed by the reactive melt infiltration process is 1:1;
   4) preparing an environmental barrier coating on a surface of the preform obtained in step 3), wherein a thickness of the environmental barrier coating is between 60 μm to 150 μm; and
   5) preparing a thermal barrier coating on the surface of the preform obtained in step 4), thereby obtaining the SiC$_f$/SiC composite flame tube, wherein a thickness of the thermal barrier coating is between 100 μm to 150 μm.

2. The method according to claim 1, wherein the interface layer in step 1) is one or more of PyC, SiC, B$_4$C, ZrC, HfC, TaC, Si$_3$N$_4$, BN.

3. The method according to claim 1, wherein the chemical vapor infiltration process in step 1) comprises the steps of:
placing the SiC fiber into a chemical vapor infiltration furnace and choosing a precursor for preparing the interface layer in step 1); introducing a gas into the chemical vapor infiltration furnace by a bubble method by maintaining a temperature ranges from about 500° C.-1400° C. for a time period of about 60 minutes to 600 minutes and a pressure ranges from about 0.5 KPa to 12 KPa, wherein the gas is a mixture of hydrogen and argon, wherein the thickness of the infiltration interface layer obtained in step 1) ranges from about 100 nm to 2 μm;
wherein the precursor is selected from the group consisting of methane, methyltrichlorosilane, boron chloride, zirconium chloride, tantalum chloride, silicon chloride, boron halide, and ammonia.

4. The method according to claim 1, wherein the step 2) of laying the unidirectional tape and winding of the SiC fiber having the continuous interface layer to form the perform comprises the steps of:
S1: cleaning the surface of a flame tube mold by acetone to remove impurities attached on the surface and coating the surface of the flame tube mold uniformly with an epoxy resin release agent, and heating the flame tube mold at a temperature range from about 30° C. to 50° C.;
S2: laying said SiC fiber with a volume content of about 40%-65% and the prepreg unidirectional tape with the epoxy resin release agent on the surface of the flame tube mold;
S3: winding said SiC fiber with a volume content of 50% to 70% and the prepreg unidirectional tape with the epoxy resin release agent on the surface of the flame tube mold in step S2) through a winding machine;
S4: putting the wounded SiC fiber obtained in S3 into a curing furnace for curing and forming-at a temperature ranges from about 90° C.-165° C.; and
S5: demolding and obtaining the preform of the net size molding.

5. The method according to claim 1, wherein the reactive melt infiltration process in step 3) is a molten silicon infiltration process, which is carried out using at least any one of a vacuum atmospheric infiltration furnace and a vacuum siliconizing furnace at a temperature ranges from about 1400° C. to 1800° C. and pressure of 2 Pa.

6. The method according to claim 1, wherein a precursor used in the chemical vapor infiltration process is methyltrichlorosilane.

7. The method according to claim 1, wherein the environmental barrier coating in step 4) includes a Si bonding layer, a rare earth monosilicate (Re$_2$SiO$_5$) surface layer, and a ytterbium disilicate (Yb$_2$Si$_2$O$_7$) intermediate layer located between the Si bonding layer and the rare earth monosilicate Re$_2$SiO$_5$ surface layer,
wherein a thickness ratio of the Si bonding layer, the Yb$_2$Si$_2$O$_7$ intermediate layer, and the rare earth monosilicate Re$_2$SiO$_5$ surface layer is 1-2:1-2:1-3; and
wherein the rare earth monosilicate Re$_2$SiO$_5$ surface layer is selected from at least one of Y$_2$SiO$_5$, Sc$_2$SiO$_5$, Gd$_2$SiO$_5$, Er$_2$SiO$_5$, Tm$_2$SiO$_5$, Yb$_2$SiO$_5$, Lu$_2$SiO$_5$.

8. The method according to claim 1, wherein the environmental barrier coating is prepared by a process, comprising the steps of:
(1): grinding Yb$_2$Si$_2$O$_7$ and Re$_2$SiO$_5$ respectively until the ground particle size is between 20 μm to 80 μm, thereby obtaining Yb$_2$Si$_2$O$_7$ powder and Re$_2$SiO$_5$ powder;
(2): putting the preform into an inert protective atmosphere and heating at a temperature ranges of about 1450° C. to 1800° C. for a time period of about 1 hour to 4 hours to form a Si bonding layer;
(3): spraying Yb$_2$Si$_2$O$_7$ powder obtained in step (1) on the preform with the Si bonding layer by adopting a plasma spraying method to form an intermediate layer; and
(4): spraying Re$_2$SiO$_5$ powder on the preform with the bonding layer and the intermediate layer by adopting a plasma spraying method to obtain the environmental barrier coating.

* * * * *

UNITED STATES PATENT AND TRADEMARK OFFICE
CERTIFICATE OF CORRECTION

PATENT NO. : 11,591,267 B2
APPLICATION NO. : 17/474091
DATED : February 28, 2023
INVENTOR(S) : Haitang Yang It is certified that error appears in the above-identified patent and that said Letters Patent is hereby corrected as shown below:

On the Title Page

Item [86]:
PCT International Application No. : PCT/CN2020/101903
Insert the correct PCT filing date --2020-07-14 (July 14, 2020).--

Signed and Sealed this
Twenty-fifth Day of April, 2023

Katherine Kelly Vidal
*Director of the United States Patent and Trademark Office*